United States Patent [19]

Fukaya

[11] Patent Number: 5,869,355
[45] Date of Patent: Feb. 9, 1999

[54] LEAD FRAME WITH INCREASED STRENGTH AND MANUFACTURE OF SEMICONDUCTOR DEVICE

[75] Inventor: Hitoshi Fukaya, Hamamatsu, Japan

[73] Assignee: Yamaha Corp., Shizuoka, Japan

[21] Appl. No.: 870,371

[22] Filed: Jun. 6, 1997

[30] Foreign Application Priority Data

Jun. 11, 1996 [JP] Japan .................................. 8-171853

[51] Int. Cl.⁶ .......................... H01L 21/44; H01L 21/48; H01L 21/50
[52] U.S. Cl. .......................... 438/123; 438/111; 438/112
[58] Field of Search .................................. 438/111, 123, 438/112, 366, 377, 380

[56] References Cited

U.S. PATENT DOCUMENTS

| | | | |
|---|---|---|---|
| 4,195,193 | 3/1980 | Grabbe et al. | 174/52 |
| 4,204,317 | 5/1980 | Winn | 29/827 |
| 4,835,120 | 5/1989 | Mallik et al. | 437/209 |
| 4,868,635 | 9/1989 | Frechette et al. | 357/70 |
| 4,984,059 | 1/1991 | Kubota et al. | 357/68 |
| 4,999,700 | 3/1991 | Dunaway et al. | 357/70 |
| 5,249,354 | 10/1993 | Richman | 29/827 |
| 5,327,008 | 7/1994 | Djennas et al. | 357/666 |
| 5,381,037 | 1/1995 | Olivarez . | |
| 5,409,866 | 4/1995 | Sato et al. | 437/211 |
| 5,696,029 | 12/1997 | Alvarez et al. | 437/207 |

*Primary Examiner*—John F. Niebling
*Assistant Examiner*—David A. Zarneke

[57] ABSTRACT

A lead frame is prepared which has a plurality of leads whose inner lead portions are coupled to a support member and a notch formed across the bottom surface of each inner lead portion near at its front portion on the support member side. After an LSI chip is adhered to the support member, pads on the chip are connected via bonding wires to corresponding inner leads of the plurality of leads. The chip and inner lead portions are buried in an insulating layer made of resin or the like as protective coating. Each inner lead portion is cut with a cutting device such as laser beam at the notch position to separate the inner lead portion from the support member. Thereafter, the separated assembly unit is accommodated in a package made of resin or the like, and the outer leads are cut and shaped. For an assembly method of a semiconductor device including a wire bonding process, bonding defects to be caused by deformed leads can be reduced.

6 Claims, 9 Drawing Sheets

LEAD FRAME WITH INCREASED STRENGTH AND MANUFACTURE OF SEMICONDUCTOR DEVICE

This application is based on Japanese Patent Application No. 8-171853 filed on Jun. 11, 1996, the entire contents of which are incorporated herein by reference.

BACKGROUND OF THE INVENTION a) Field of the Invention

The present invention relates to a lead frame and the manufacture of semiconductor devices, and more particularly to a method of manufacture a lead frame and a semiconductor device capable of improving process yield.

b) Description of the Related Art

Lead frames used for the assembly of LSI devices such as shown in FIGS. 9 and 10 have been proposed heretofore.

A lead frame 10 is formed by punching a lead frame material plate made of, for example, alloy 42 (Fe alloy containing 42% Ni). A support member (die stage) 12 for supporting a semiconductor chip is suspended from an outer frame 11 by tie bars (suspension pins) 14a to 14d. A number of leads 16 supported by the outer frame 11 and dam bars 15 are disposed around the support member 12, front tips of the leads 16 being spaced apart from the support member 12.

A lead frame 10 is generally of a long strip of a lead frame material plate, and a plurality of (e.g., five) assembly units each having the support member 12 and leads 16 such as shown in FIG. 9 are placed side by side. Near at the side edges (upper and lower edges as viewed in FIG. 9) of the lead frame along its longitudinal direction, positioning holes 10a and 10b are formed for positioning the lead frame when it is mounted on a jig. As shown in FIG. 10, each lead 16 has an inner lead 16x and an outer lead 16y. The inner lead is a portion of the lead which is covered with molding resin, and the outer lead is a portion of the lead which is exposed at the outer area of the molding resin region. The dam bar 15 coupling together the outer leads is removed through punching or the like after the molding process.

With reference to FIGS. 11 to 13, an example of conventional assembly methods will be described. At the process illustrated in FIG. 11, an LSI chip 18 is adhered to the support member 12 with Ag paste or the like. In this case, bonding pads formed on the LSI chip 18 are on the top surface opposite to the adhesion surface. The adhesion state of the LSI chip is also shown in FIGS. 9 and 10. Thereafter, a plurality of bonding pads on the LSI chip 18 are connected by bonding wires 20A and 20B to corresponding inner leads of the leads 16A and 16B which are illustratively shown among a number of leads 16.

At the process illustrated in FIG. 12, the chip 18, bonding wires 20A and 20B, and inner leads of the leads 16A and 16B are hermetically sealed with resin 22. A broken line 22S shown in FIG. 10 indicates a contour of the resin 22.

At the next process illustrated in FIG. 13, the outer lead of each lead is solder plated when necessary, and thereafter each outer lead is cut to separate the respective leads and the assembly unit covered with the resin 22 from the lead frame 10. After the outer leads are cut, the leads 16A and 16B are shaped as shown in FIG. 13 which is a side view of an LSI device formed after the lead plating process, lead cutting process, lead shaping process, and the like.

In another conventional method already proposed, a lead frame in the form of a reel of tape is used for assembling discrete components such as transistors, the processes of chip adhesion, wire bonding, and resin molding are collectively performed, and thereafter the processes of lead plating, lead cutting, and lead shaping are sequentially and separately performed.

With the conventional technique described with FIGS. 9 to 13, each lead is supported, as shown in FIG. 10, only at its outer lead to the dam bar and outer frame of the lead frame, and the inner lead is not fixed positively except that it is connected to the outer lead. If an external force is applied, for example, to the front tip of the inner lead 16x while the lead frame is transported from one process to another, the inner lead becomes likely to bend or curve. This deformation of the inner lead 16x may often result in bonding defects of the bonding wires 20A and 20B.

As the mold 22 flows in the cavity of a molding machine during the resin molding process after wire bonding, the wires 20A and 20B become likely to be displaced from proper positions (wire sweep-away). This wire sweep-away may cause broken wires and/or wire short.

The assembly processes such as chip adhesion, wire bonding, and resin molding are performed separately. It is therefore necessary to transport a lead frame from one process to another, which lowers production efficiency. As described above, in order to improve the production efficiency, a continuous assembly method has been proposed in which a lead frame in the form of a reel of tape is used to collectively perform a plurality of assembly processes.

However, a lead frame in the form of a reel of tape is required to be wound around a reel. Therefore, the inner lead 16x is likely to be deformed and bonding defects may possibly occur. This continuous assembly method cannot be adopted therefore unless some countermeasure is taken into consideration.

SUMMARY OF THE INVENTION

It is an object of the present invention to provide an assembly method for semiconductor devices capable of preventing bonding defects to be caused by lead deformation.

It is another object of the present invention to provide a lead frame capable of preventing bonding defects to be caused by lead deformation.

According to one aspect of the present invention, there is provided a method of assembling a semiconductor device comprising the steps of: preparing a lead frame having a plurality of leads disposed around a support member for supporting a semiconductor chip, each of the leads having an inner lead portion and an outer lead portion, and the inner lead portion being connected to the support member; adhering a semiconductor chip having a plurality of electrodes formed on one main surface thereof to the support member at another main surface opposite to the one main surface; connecting the plurality of electrodes via a plurality of bonding wires to corresponding inner lead portions of the plurality of leads; forming an insulating layer as protective coating, the insulating layer covering a top surface of an assembly unit including the semiconductor chip, the plurality of bonding wires, the support member, and the inner lead portions of the plurality of leads; and separating the inner lead portion of each lead among the plurality of leads from the supporting member, at a position between the support member and a contact area of the bonding wire to the inner lead portion, in the state wherein the top surface of the assembly unit is covered with the insulating layer.

The inner lead portion of each lead is maintained to be connected to the support member before the separation process. Therefore, the front tip portion of the inner lead portion is less bent or curved during the transportation of the lead frame, and bonding defects to be caused by lead deformation can be reduced. Since the assembly unit including the bonding wires, inner lead portions and the like is protectively coated with the insulating layer, damages of the bonding wires can be prevented when the inner lead portions are separated from the support member with cutting means or the like.

After the inner lead portions of the plurality of leads are separated from the support member, the assembly unit covered with the insulating layer may be resin molded, with the outer lead portions of the plurality of leads being exposed outside of the resin molded region. In this case, since the bonding wires are covered with the insulating layer, wire sweep-away is reduced during the resin molding process and broken wires and wire short can be reduced.

Even if a lead frame in the form of a reel of tape is used, the inner lead portions is less deformed because they are coupled to the support member, and a continuous assembly system can be used reliably.

DETAILED DESCRIPTION OF THE PREFERRED EMBODIMENTS

Figure 1:
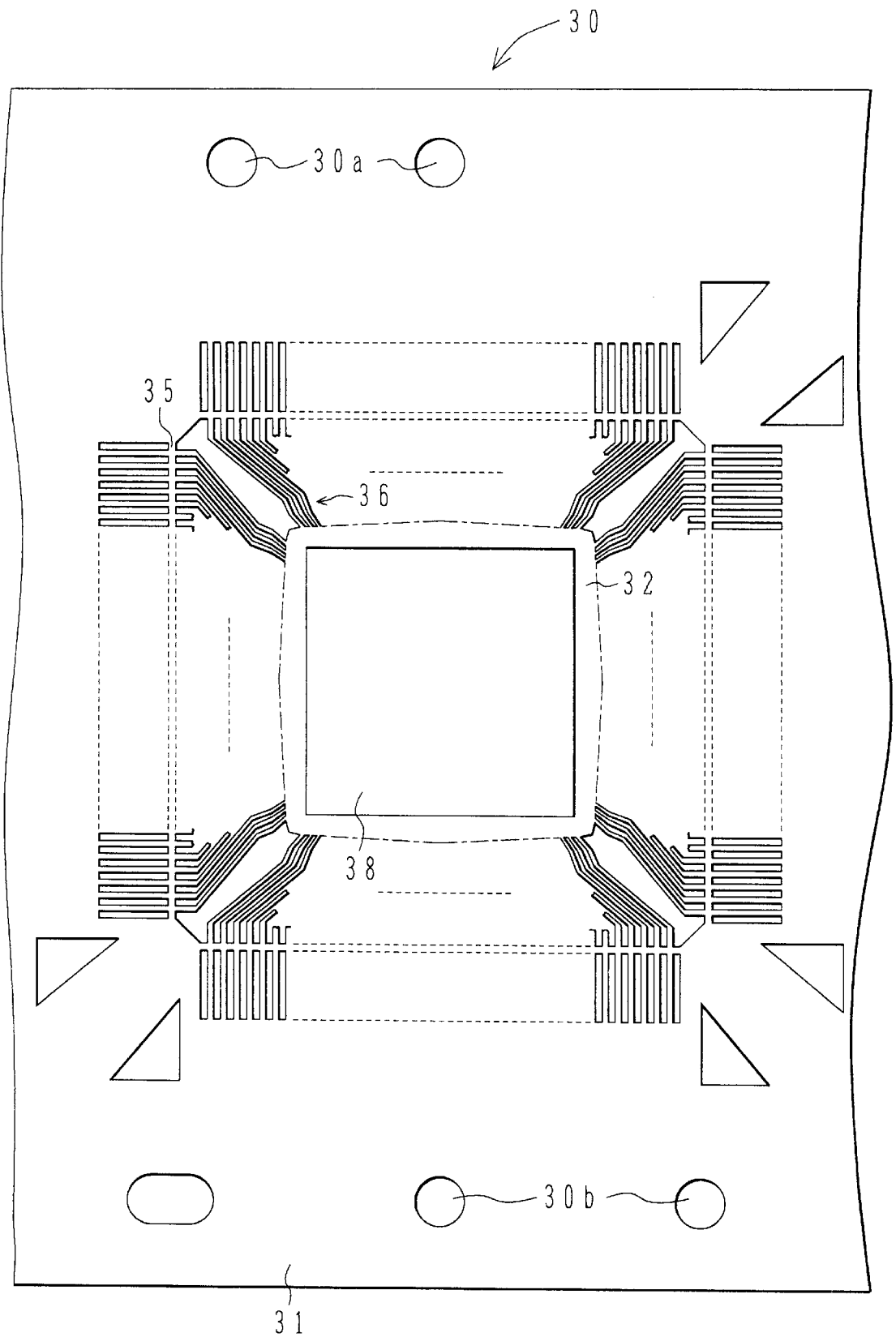
FIG. 1 is a plan view of a lead frame according to an embodiment of the invention.
Figure 2:
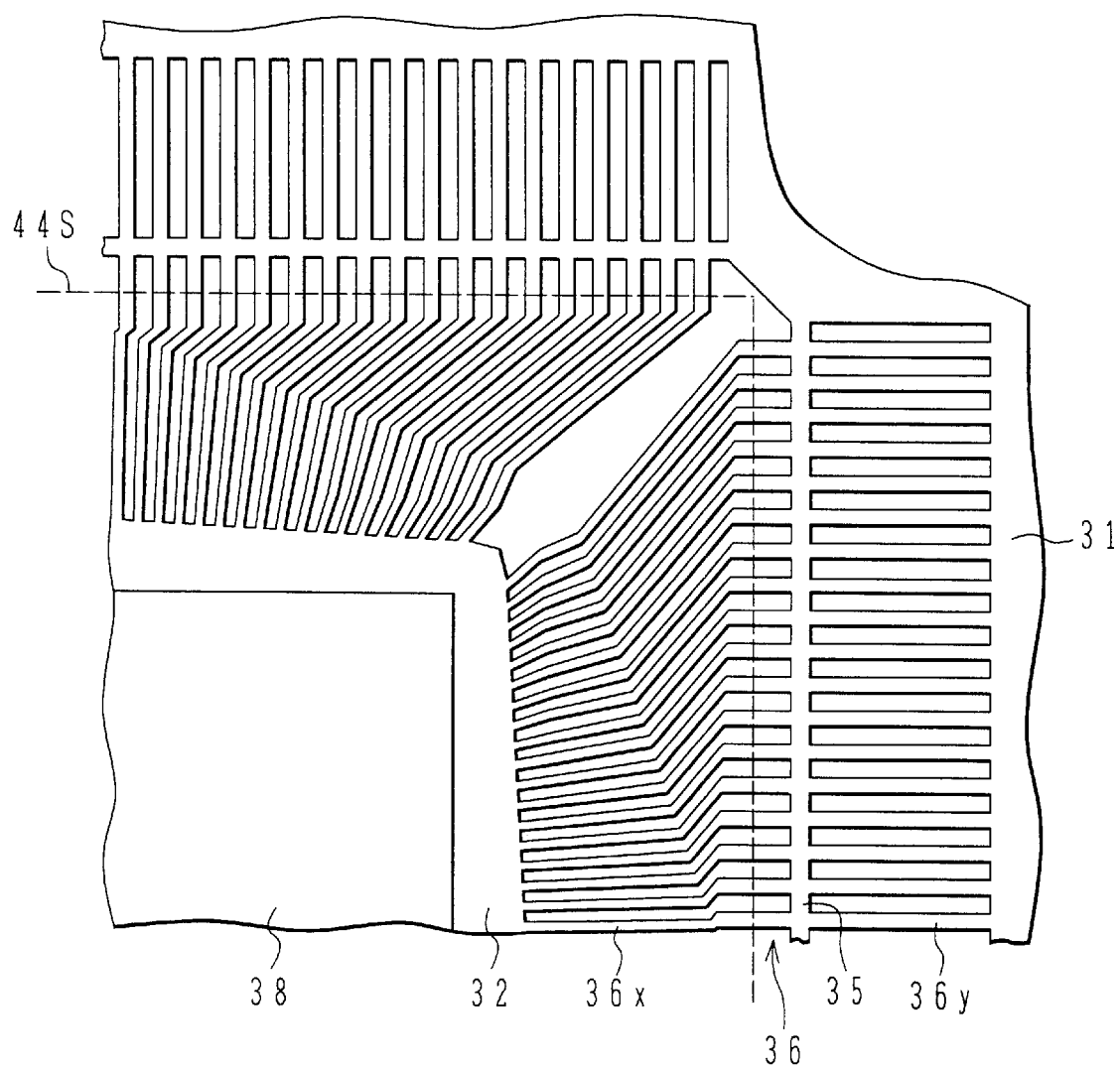
FIG. 2 is an enlarged plan view showing a portion of the lead frame shown in FIG. 1.

FIGS. 1 and 2 are plan views showing a lead frame according to an embodiment of the invention, wherein FIG. 2 is an enlarged plan view showing about a quarter area of the layout of the lead frame shown in FIG. 1.

Figure 9:
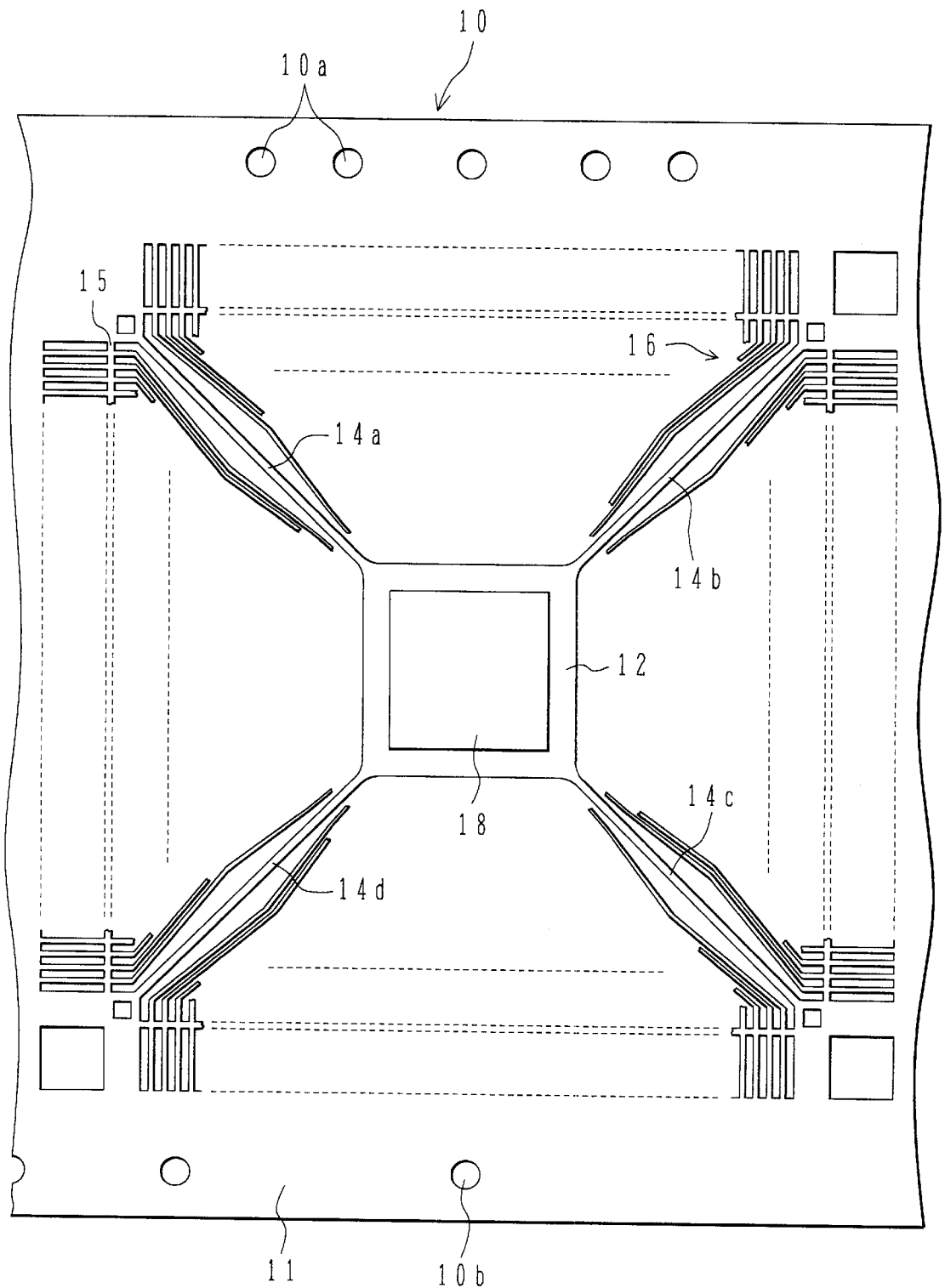
FIG. 9 is a plan view of a conventional lead frame.
Figure 10:
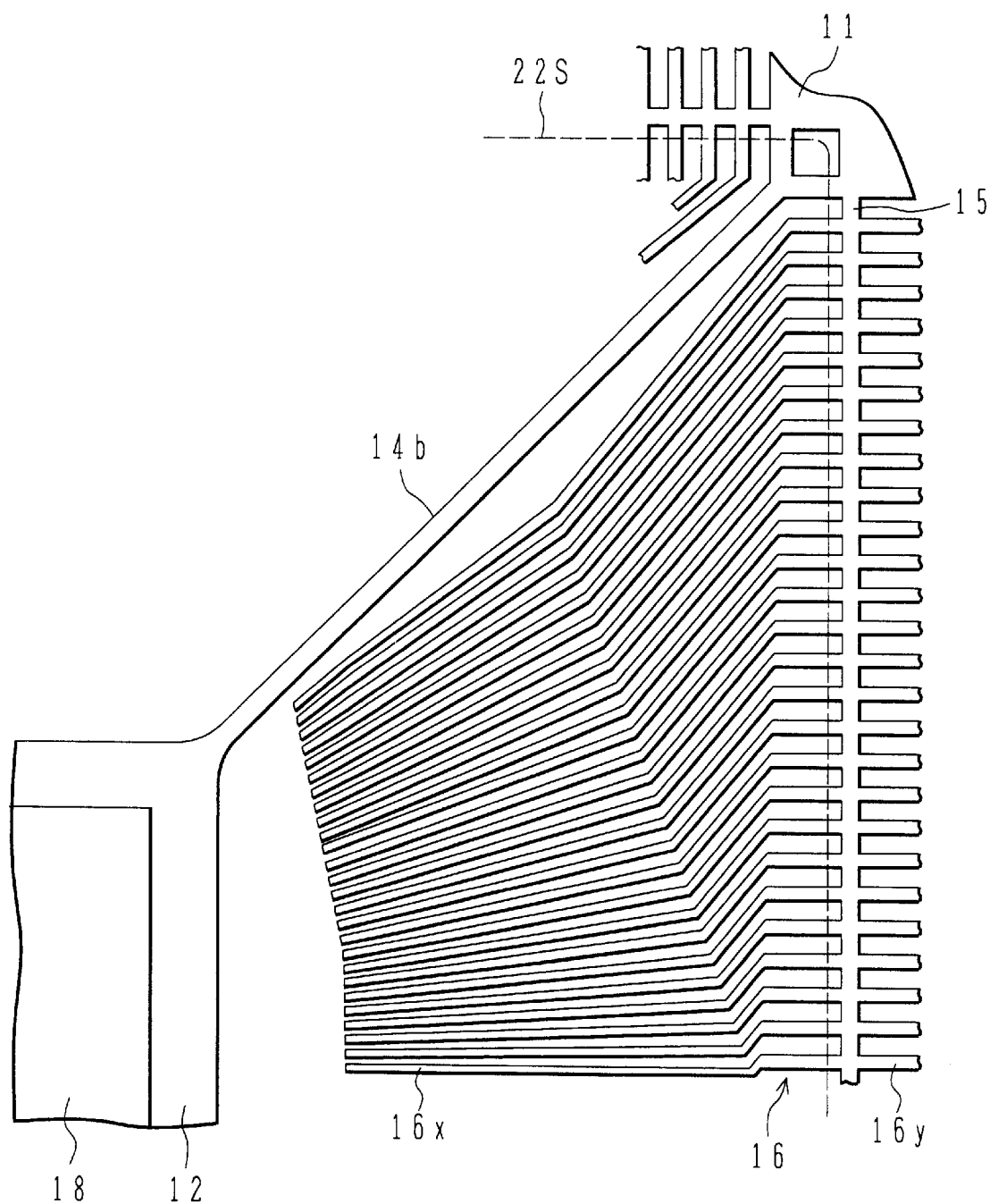
FIG. 10 is an enlarged plan view showing a portion of the lead frame shown in FIG. 9.
Figure 11:
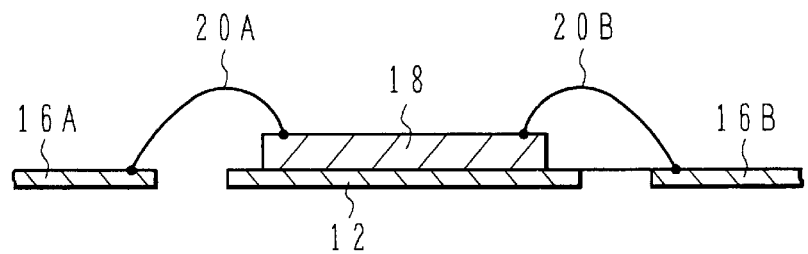
FIG. 11 is a cross sectional view illustrating a chip adhesion process and a wire bonding process for the lead frame shown in FIG. 9.
Figure 12:
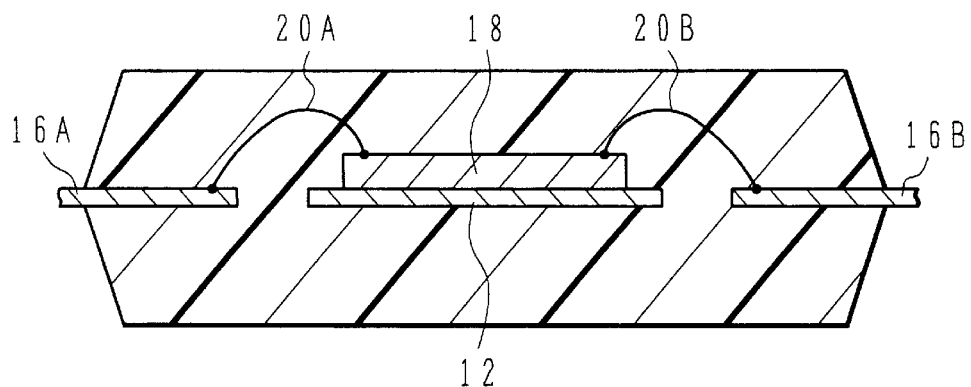
FIG. 12 is a cross sectional view illustrating a resin molding process to be executed after the processes of FIG. 11.

A lead frame 30 is formed by punching or selectively etching a lead frame material plate made of, for example, Fe—Ni alloy such as alloy 42 (Fe alloy containing 42% Ni) or Cu-containing alloy. A number of leads 36 are disposed around a support member (die stage) 32 which supports a semiconductor chip (die) 38. As shown in FIG. 2, an inner lead 36x of each lead 36 is coupled or connected (being continuous) at its inner end to the support member 32. There is no free inner end for the inner leads. Each inner lead is continuous at its outer end with an outer lead 36y similar to conventional lead frames. The outer lead 36y is coupled at its inner end to a dam bar 35, and continuous at its outer end with an outer frame 31 of the lead frame. Since the support member 32 is suspended from the outer frame 31 by inner leads 36x of a number of leads 36, the tie bars 14a to 14d necessary for the lead frame shown in FIG. 9 may not be provided. As compared with a conventional lead frame which suspends the support member 32 only by the four tie bars, the support member of this embodiment is suspended by the inner leads along a number of directions so that it can be stabilized much more. Although the number of leads is fundamentally determined by electrical specifications of the lead frame, such as the number of external contact pads of a semiconductor chip, it is preferable to suspend the support member 32 by at least about 15 leads per one side and by at least about 60 leads in total.

A lead frame 30 is generally of a long strip of a lead frame material plate, and a plurality of (e.g., five) assembly units each having the support member 32 and leads 36 such as shown in FIG. 1 are placed side by side. Near at the side edges (upper and lower edges as viewed in FIG. 1) of each lead frame along its longitudinal direction, positioning holes 30a and 30b are formed for positioning the lead frame when it is mounted on a jig. As shown in FIG. 2, each lead 36 has an inner lead 36x and an outer lead 36y extending outward from the inner lead 36x. The lead 36 is coupled to the dam bar 35, integrally connected at its inner end to the support member 32, and integrally connected at its outer end to the outer frame 31 of the lead frame. Each lead is therefore hard to be deformed even if an external force is applied thereto.

Figure 3:
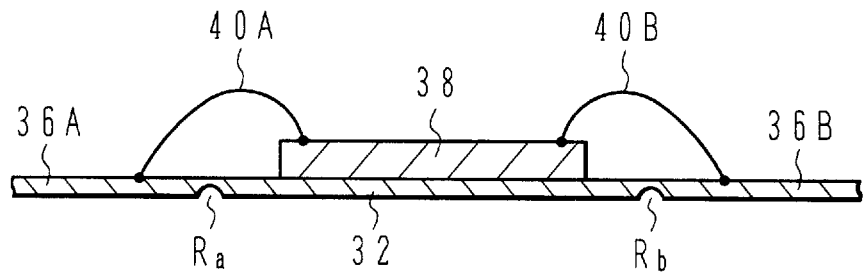
FIG. 3 is a cross sectional view illustrating a chip adhesion process and a wire bonding process for the lead frame shown in FIG. 1.

A notch such as those indicated at Ra and Rb in FIG. 3 is formed across the surface of the inner lead 36x of each lead 36 at the position between the support member 32 and a contact area of the inner lead 36x to a bonding wire. This notch is provided in order to facilitate cutting the inner lead 36x by thinning it at the cut position. The notch can be easily formed through half etching or a press work when the lead frame is punched.

Figure 7:
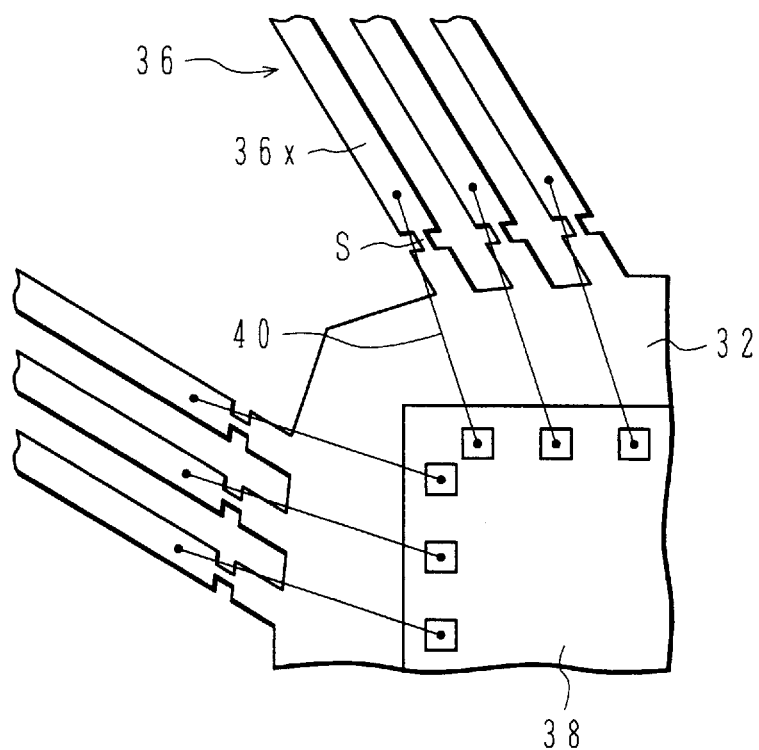
FIG. 7 is a plan view showing another example of the shape of an inner lead.

As shown in FIG. 7, in order to facilitate cutting the inner lead 36x, the inner lead 36x of each lead 36 may be formed with a narrow portion S at the position between the support member 32 and the contact area of the inner lead 36x to a bonding wire. The thickness at the narrow portion S may also be thinned like the notches Ra and Rb shown in FIG. 3. In this case, it becomes easier to cut the inner lead. Namely, the inner lead 36x has preferably a smaller cross sectional area at the contact area than other areas.

Next, with reference to FIGS. 3 to 6, an LSI assembly method using the lead frame shown in FIGS. 1 and 2 will be described.

At the process illustrated in FIG. 3, an LSI chip (semiconductor chip) 38 is adhered to the support member 12 with conductive adhesive such as Ag paste or the like. In this case, bonding pads formed on the LSI chip 38 are on the top surface opposite to the adhesion surface. The adhesion state of the LSI chip 38 is also shown in FIGS. 1 and 2. Thereafter, a plurality of electrodes (bonding pads) on the LSI chip 38 are connected by bonding wires 40A, 40B, . . . made of, for example, gold, aluminum or the like, to corresponding inner leads of the leads 36A, 36B, . . . . The leads 36A and 36B are illustratively shown among a number of leads 36. These processes are known processes. FIG. 7 shows a number of leads 36 connected via corresponding bonding wires 40 to corresponding electrodes formed on the chip 38.

During the wire bonding process illustrated in FIG. 3, the inner leads of the leads 36A and 36B are maintained to be connected to the support member 32. Therefore, the ends of the inner leads will not bent or be curved during the transportation of the lead frame and bonding defects to be caused by lead deformation can be avoided.

Figure 4:
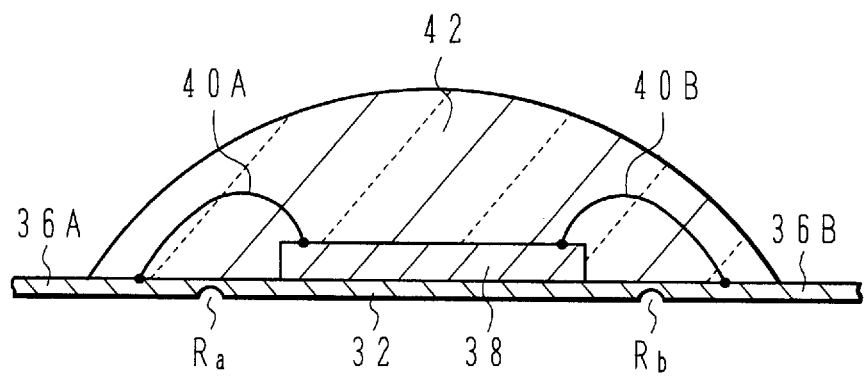
FIG. 4 is a cross sectional view illustrating a protective layer coating process to be executed after the processes of FIG. 3.

At the process illustrated in FIG. 4, the assembly unit including the chip 38, bonding wires 40A and 40B, support member 32, and inner leads of the leads 36A and 36B is coated with a protective insulating layer 42 on the side of the top surface of the lead frame. Here, it is preferable to bury all the bonding wires in the insulating layer 42. The insulating layer 42 may be formed through potting which pots liquid resin at the top surface of the lead frame.

The material of the insulating layer 42 may be silicon rubber containing material, epoxy resin or the like. The insulating layer 42 serves to protect the assembly unit during the transportation of the lead frame 30.

Figure 5:
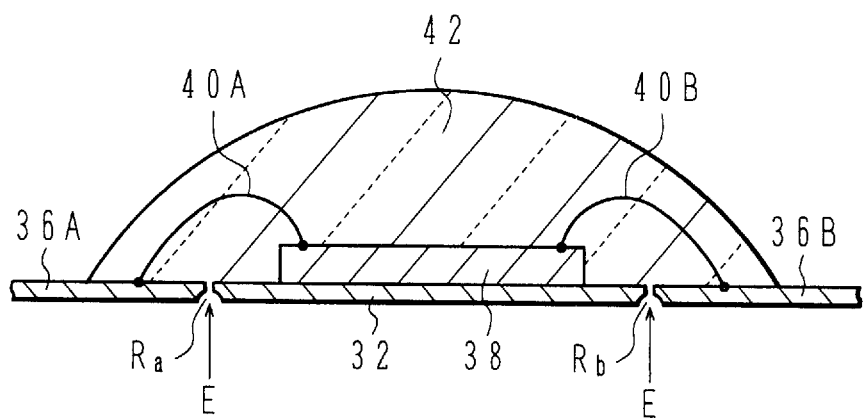
FIG. 5 is a cross sectional view illustrating an inner lead cutting process to be executed after the process of FIG. 4.

At the next process illustrated in FIG. 5, the inner leads of the leads 36A and 36B are cut at the notches Ra and Rb with cutting means, for example, with laser beam or water jet, to thereby mechanically and electrically separate the inner leads from the support member 32. The assembly unit is tightly fixed with a work holder 100. The work holder 100 is pressed against the assembly unit and tightly fits the assembly unit so as to prevent the assembly unit from displacing upon cutting. The displacement may cause undesirable disconnection of the bonding wires 40A and 40B. By virtue of the work holder 100, the bonding wires 40A and 40B are kept safely.

The thickness and/or width (i.e. the cross section) of each inner lead at the cutting area is made small as described with FIGS. 3 and 7, so that the cutting area can be cut at a spot irrespective of whether laser beam or water jet is used. Furthermore, since the assembly unit including bonding wires 40A and 40B and the like is covered with the insulating layer 42, cutting can be performed without any damage of the bonding wires. Water jet in particular can cut only the lead metal and hardly abrade resin of the insulating layer 42. Chemical processes such as etching may also be used for separating the inner lead from the support member.

Figure 6:
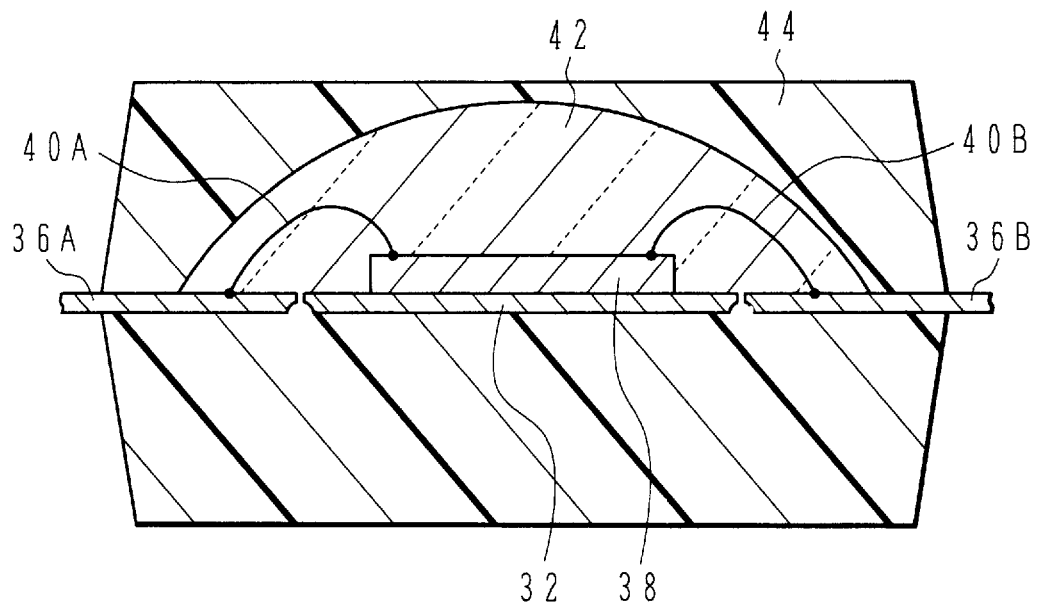
FIG. 6 is a cross sectional view illustrating a resin molding process to be executed after the process of FIG. 5.

At the process illustrated in FIG. 6, the assembly unit covered with the insulating layer 42 is hermetically molded with resin 44. This resin may be the well-known epoxy resin with filler or the like. In this molding, the outer leads of the leads 36A and 36B are exposed outside of the resin molded region. A broken line 44S shown in FIG. 2 indicates the contour of the region molded with the resin 44. Since the assembly unit covered with the insulating layer 42 is resin molded, the wire sweep-away will not occur during resin molding so that broken wires and wire short can be avoided.

Figure 13:
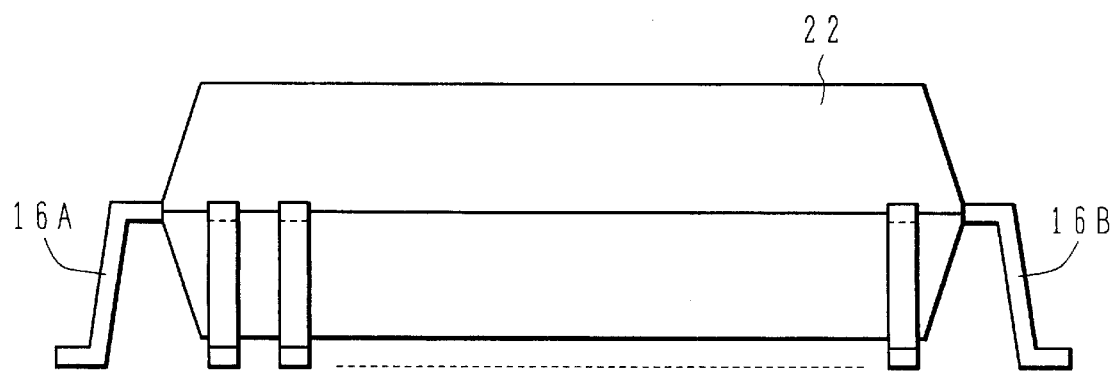
FIG. 13 is a side view of an LSI device formed after a lead plating process and a lead cutting and shaping process executed after the process of FIG. 12.

Thereafter, similar to the processes already described with FIG. 13, the outer lead of each lead is solder plated when necessary, and thereafter each outer lead is cut to separate the leads from each other and the assembly unit covered with the resin 44 from the lead frame 10. After the outer leads are cut, the leads 16A and 16B are shaped to obtain an LSI device having the side shape similar to that shown in FIG. 13.

Figure 8:
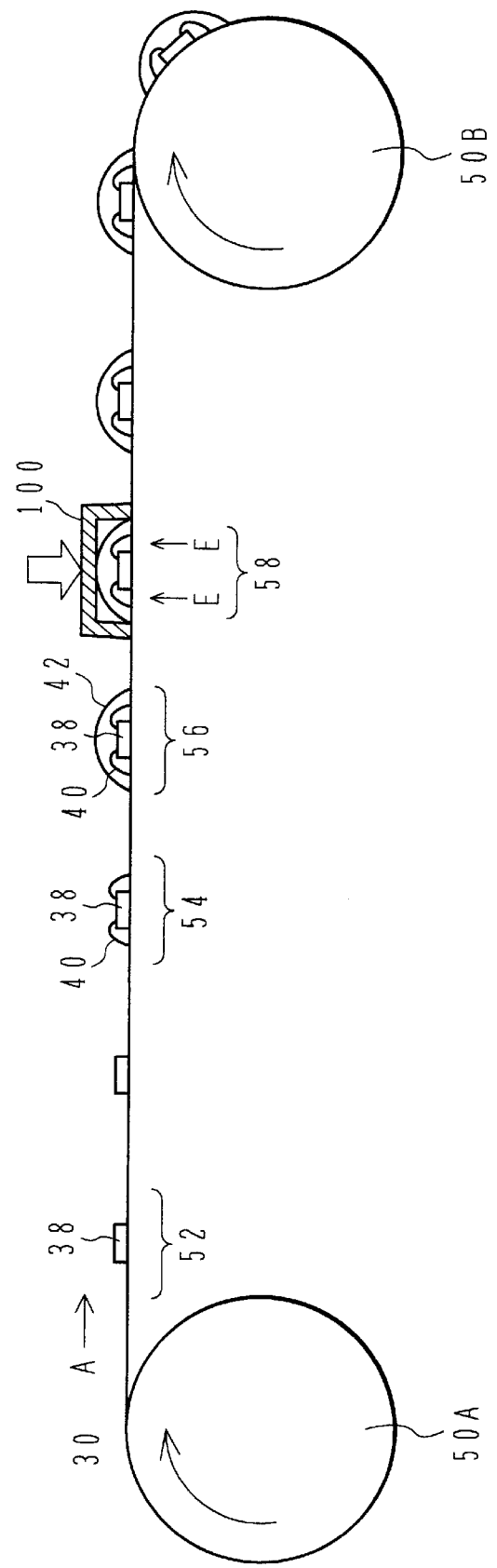
FIG. 8 is a schematic side view showing an example of a continuous assembly system capable of collectively performing the processes of FIGS. 3 to 5.

FIG. 8 shows a continuous assembly system suitable for carrying out the above-described LSI assembly method.

In the continuous assembly system shown in FIG. 8, a lead frame 30 in the form of a reel of tape is used which is wound around a supply reel 50A. The lead frame 30 has a number of assembly units each having the support member 32 and leads 36 as shown in FIG. 1, the assembly units being juxtaposed along the longitudinal direction of the tape.

The lead frame 30 extends between the supply reel 50A and a take-up reel 50B which are rotated by an unrepresented drive means such as a motor. The lead frame 30 is wound around the take-up reel 50A while the reels 50A and 50B are rotated, and as the lead frame 30 is wound around the take-up reel 50A, it moves in the direction indicated by an arrow A along a linear transport path.

On the transport path of the lead frame 30, process stages 52, 54, 56, and 58 are disposed at proper intervals along the transport direction A. The process stage 52 is a chip adhesion stage whereat the LSI chip 38 is adhered to the support member of the lead frame 30 in the manner similar to that described with FIG. 3.

The process stage 54 is a wire bonding stage whereat a number of electrodes on the chip 38 are connected via a number of bonding wires to corresponding inner leads of the lead frame 30 in the manner similar to that described with FIG. 3.

The process stage 56 is a protective layer coating stage whereat the assembly unit having the chip 38, wires 40 and the like is protectively coated with or buried in the insulating layer 42 in the manner similar to that described with FIG. 4.

The process stage 58 is an inner lead cutting stage whereat the inner lead of each lead is cut with a cutting means E to mechanically and electrically separate the inner lead from the support member, in the manner similar to that described with FIG. 5.

The assembly unit after the process at the process stage 58 is wound around the take-up reel 50B. Since the assembly unit is covered with the insulating layer 42, the assembly unit can be protected from any damage during the take-up operation.

The lead frame may be transported intermittently so that the process stage having the longest process time among the process stages 52 to 58 can complete its process.

After the lead frame 30 is fully wound around the take-up reel 50B, this reel 50B is sent to an unrepresented other continuous assembly system in which this reel 50B is used as a supply reel and the lead frame 30 is wound around an unrepresented other take-up reel. As the lead frame 30 is transported, the resin molding process, lead solder plating process, and lead cutting and shaping process described with FIG. 5 are sequentially performed.

Use of the above-described continuous assembly systems can improve the production efficiency while preventing bonding wire defects and sweep-away and achieving high manufacture yield.

The present invention has been described in connection with the preferred embodiments. The invention is not limited only to the above embodiments. It is apparent to those skilled in the art that various modifications, improvements, combinations, and the like can be made. For example, the following modifications are possible.

(1) After the inner lead cutting process shown in FIG. 5, an insulating film as protective coating like the insulating layer 42 may be formed if necessary on the bottom surface of the lead frame, covering the support member 32 and the front end portions of the inner leads of the leads 36A and 36B. In this case, the resin molding process shown in FIG. 6 may be omitted and the assembly unit is separated from the lead frame by the lead cutting process. The assembly unit formed in this manner has the insulating layers as protective coating on the top and bottom surfaces thereof. Therefore, this unit can be used by connecting it to a printed circuit board, or if desired, by accommodating it in a package.

(2) The package is not limited only to a resin molded package, but a hollow package made of plastics or ceramics may also be used. If hollow packages are used, the assembly unit still on the lead frame may be accommodated in a hollow package after the inner lead cutting process shown in FIG. 5, or the assembly unit separated from the lead frame by the lead cutting process after the inner lead cutting process shown in FIG. 5 may be accommodated in a hollow package.

Figure 14:
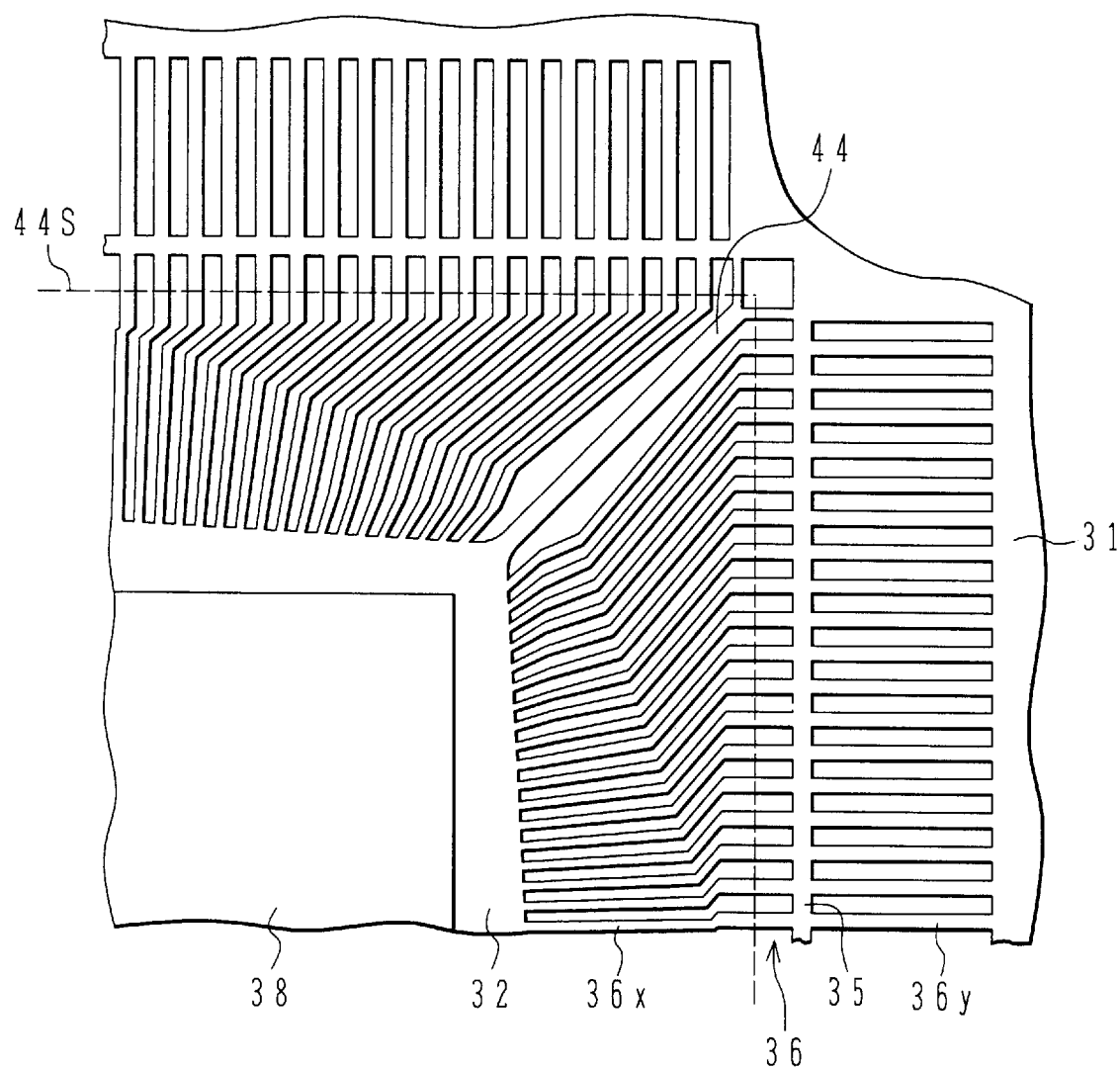
FIG. 14 is a plan view showing another example of the shape of an inner lead.
Figure 15:
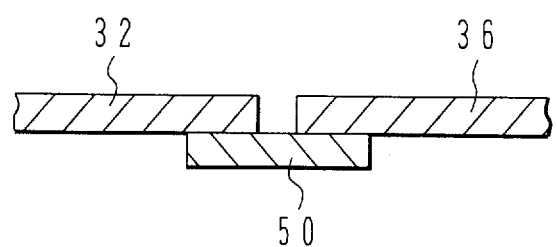
FIG. 15 is a cross sectional view illustrating another configuration of a lead frame.

(3) Although the lead frame without tie bars has been described, these tie bars may be formed. FIG. 14 shows a lead frame with tie bars. Tie bars 44 interconnect the support member 32 and the outer frame 31 of the lead frame, and a plurality of leads 36 interconnect the support member 32 and the outer frame 31. This lead frame can be used in the manner similar to the above-described embodiment. Since the support member 32 is supported by the tie bars 44, the lead cutting process, resin molding process, and the like can be performed more stably.

(4) Although lead frames having continuous die stage and inner leads have been described, the inner leads 36 and die stage 32 may also be formed of separated members and coupled by coupling means 50 such as metal members of different material than the die stage 32 and the leads 36 or a plastic member. Such a coupling means can be removed after burying the chip and bonding wires in the insulating layer, similar to the above-described process. Alternatively, the coupling means 50 may be left unremoved when it is made of an insulating material.

I claim:

1. A method of assembling a semiconductor device comprising the steps of:
    a) preparing a lead frame having a plurality of leads disposed around a support member for supporting a semiconductor chip, each of the leads having an inner lead portion and an outer lead portion, and the inner lead portion being connected to the support member;
    b) adhering a semiconductor chip having a plurality of electrodes formed on one main surface thereof to the support member at another main surface thereof to the support member at another main surface opposite to the one main surface;
    c) connecting the plurality of electrodes via a plurality of bonding wires to corresponding inner lead portions of the plurality of leads;
    d) forming an insulating layer as a protective coating, the insulating layer covering a top surface of an assembly unit including the semiconductor chip, the plurality of bonding wires the support member, and the inner lead portions of the plurality of leads; and
    e) separating the inner lead portion of each lead among the plurality of leads from the supporting member, at a position between the support member and a contact area of the bonding wire to the inner lead portion, under the condition that the top surface of the assembly unit is covered with the insulating layer.

2. The method according to claim 1, wherein said separating step e) is performed at a bottom surface of the assembly unit.

3. The method according to claim 2, wherein said separating step e) is performed by using water jet.

4. The method according to claim 2, wherein said separating step e) is performed by using laser beam.

5. The method according to claim 2, wherein said separating step e) is performed by a chemical process.

6. The method according to claim 1, further comprising the step of:
    resin molding and sealing the assembly unit covered with the insulating layer, with the outer lead portions of the plurality of leads being exposed outside of the resin molded region, after said step d).

\* \* \* \* \*